United States Patent [19]

Rippel

[11] Patent Number: 5,041,780
[45] Date of Patent: Aug. 20, 1991

[54] INTEGRABLE CURRENT SENSORS

[75] Inventor: Wally E. Rippel, Altadena, Calif.

[73] Assignee: California Institute of Technology, Pasadena, Calif.

[21] Appl. No.: 243,808

[22] Filed: Sep. 13, 1988

[51] Int. Cl.$^5$ .................... G01R 33/00; G01R 33/06
[52] U.S. Cl. .................... 324/117 H; 324/117 R; 324/251; 338/32 H
[58] Field of Search ............ 324/251, 254, 117 R, 324/117 H, 127; 338/32 H; 336/84 R, 84 C, 84 M

[56] References Cited

U.S. PATENT DOCUMENTS

| 1,810,539 | 6/1931 | Sokoloff | 324/252 |
|---|---|---|---|
| 3,801,907 | 4/1974 | Lilienstein | 324/117 R |
| 4,262,275 | 4/1981 | DeMarco et al. | 338/32 H |
| 4,272,724 | 6/1981 | Wada et al. | 324/117 R |
| 4,283,643 | 8/1981 | Levin | 307/309 |
| 4,539,520 | 9/1985 | McBride | 324/117 |
| 4,559,495 | 12/1985 | Lienhard | 324/117 R |
| 4,580,095 | 4/1986 | De Vries | 324/126 |
| 4,616,174 | 10/1986 | Jorgenson | 324/117 R |
| 4,639,665 | 1/1987 | Gary | 324/117 |
| 4,692,703 | 9/1987 | Extance et al. | 324/251 |
| 4,709,205 | 11/1987 | Baurand et al. | 336/84 C |
| 4,794,326 | 12/1988 | Friedl | 324/117 R |
| 4,823,075 | 4/1989 | Alley | 324/117 H |
| 4,894,610 | 1/1990 | Friedl | 324/117 R |

FOREIGN PATENT DOCUMENTS

1137506 10/1962 Fed. Rep. of Germany .
825137 12/1959 United Kingdom .

Primary Examiner—Kenneth Wieder
Assistant Examiner—William J. Burns
Attorney, Agent, or Firm—Antonio M. Fernandez

[57] ABSTRACT

A current conductor is provided with opposing notches to produce a restricted section and with magnetic flux sensors on opposite sides of the restricted current section. The flux sensors are connected to differential amplification circuitry. The restricted section increases the concentration of magnetic flux sensed, and the differential amplification circuitry eliminates the sensing of currents in external conductive paths. An electrostatic shield is provided between the shaped conductor and the magnetic flux sensors to elminate electrostatic effects on the output signal. The flux sensors and differential amplification circuitry is fabricated in an integrated circuit chip. For small currents, the shaped conductor may be deposited on the chip; otherwise a shaped conductor is formed and a mounting substrate of insulating material, such as ceramic, is used to support the integrated circuit chip on the shaped conductor with each of the two sensors centered respectively within the two opposite notches.

11 Claims, 5 Drawing Sheets

INTEGRABLE CURRENT SENSORS

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

This invention relates to a current, i(t), sensor utilizing at least one magnetic flux sensing element, but preferably two differentially connected flux sensing elements positioned on opposite sides of a current carrying conductor so shaped as to concentrate flux between the elements. The current sensor further includes means for electrostatically shielding the elements.

BACKGROUND OF THE INVENTION

For virtually all electronic power processing systems, current sensing is an important and necessary function, it is necessary in any system that provides current limiting or over-current protection. It is also necessary in systems that continually utilize current information to achieve control, such as current mode programming where the current may have a dc component and an ac component which may not necessarily be sinusoidal, and where the instantaneous current, i(t), is to be continually sensed.

Although existing current sensing techniques are generally adequate for conventional applications, the advent of power integrated circuits (PICs) and smart modules has added new requirements not satisfied by conventional current sensing techniques. In particular for PIC applications, the current sensor needs to be monolithic with other power processing and control functions, yet provide an isolated signal of high quality. In the case of smart modules, the current sensor needs to be a two-dimensional element that integrates directly with the conductor structure without impacting mechanical or thermal design considerations. What is needed is a low cost integrated circuit current sensor with isolation, high accuracy and wide bandwidth.

SUMMARY OF THE INVENTION

In accordance with the present invention, an integrable current sensor is comprised of a conductor having a constriction in one region to reduce the cross section through which total current to be monitored must pass. At least one, but preferably two, magnetic flux sensing elements are placed near the conductor. In the case of two, they are placed on opposite sides of the constricted region and connected to a differential amplifier. The flux sensing elements may be, for example, Hall effect or magnetoresistive elements which may be readily fabricated as part of a monolithic integrated circuit together with the differential amplifier. Electrostatic shielding may be provided between the current sensors and the shaped conductor to eliminate electrostatic effects on the output signal. The effect on the differentially connected elements is production of a voltage across the elements proportional to the strength of a magnetic field, which in turn is proportional to the total current passing through the restrictive region. Although one element will benefit from the technique of shaping the conductor to concentrate the flux produced by the total current, two differentially connected sensors are preferred to increase sensitivity and reject sensing of flux from external sources.

The sensor elements and amplification circuitry are fabricated as part of an integrated circuit chip which is mounted on a substrate (supporting block of ceramic or similar dielectric material) and the mounting substrate is in turn bonded onto the shaped conductor with the sensor elements positioned on opposite sides of the conductor in the restricted region. For this purpose, the conductor is preferably a flat strip of conductive material, such as copper, stamped or otherwise caused to have notches that define the restrictive region. The conductor extends well beyond the substrate for connection to external circuitry. Connections to the current sensor on the integrated circuit chip are made directly at bonding pads conventionally produced on the chip.

For low currents, the entire current sensor is preferably fabricated as a monolithic integrated circuit in a layer of suitable semiconductor material produced on a substrate using conventional integrated circuit technology. After thus integrating the sensors with the amplification circuitry, an insulating oxide layer is grown over the chip before the shaped conductor is deposited. Electrostatic shielding may be provided by first growing an initial insulating oxide layer and then depositing a very thin film of nonmagnetic metal, such as copper or gold. Then, before depositing the shaped conductor, a second insulating oxide layer is deposited.

The novel features that are considered characteristic of this invention are set forth with particularity in the appended claims. The invention will best be understood from the following description when read in connection with the accompanying drawings.

BRIEF DESCRIPTION OF THE DRAWINGS

FIGS. 5a(1) and (2), 5b(1) and (2), 5c(1) and (2) and 5d(1) and (2) each illustrate in parts (1) and (2) plan and side views of conductors having notches cut out to produce restrictive regions for the total current to pass through FIG. 6 illustrates a cross section of a conductor taken along a line 6-6 in FIG. 5a(1) and two discrete Hall effect sensors positioned on opposite sides of the restrictive region of the conductor in accordance with the broadset aspect of the present invention.

DESCRIPTION OF PREFERRED EMBODIMENTS

Figure 1A:
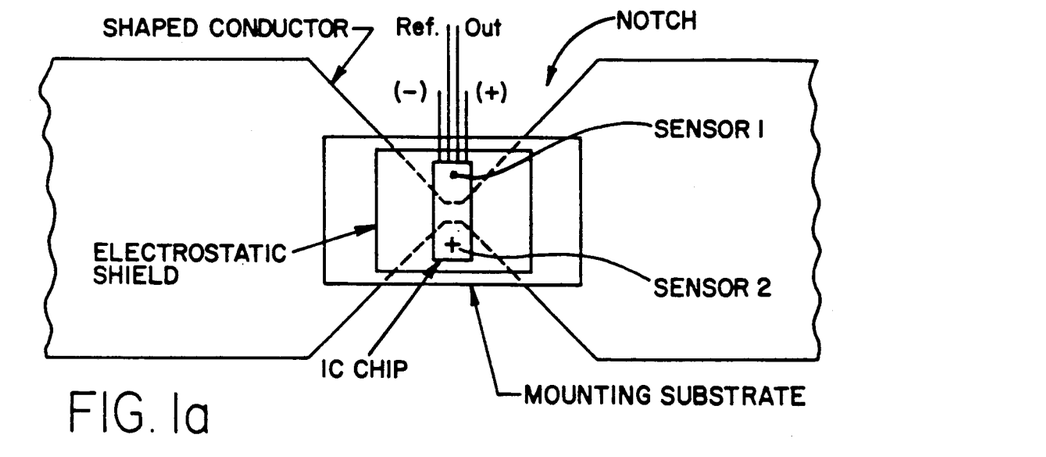
FIG. 1a illustrates a plan view and FIG. 1b illustrates a side view of an integrated current sensor in accordance with the present invention.
Figure 1B:
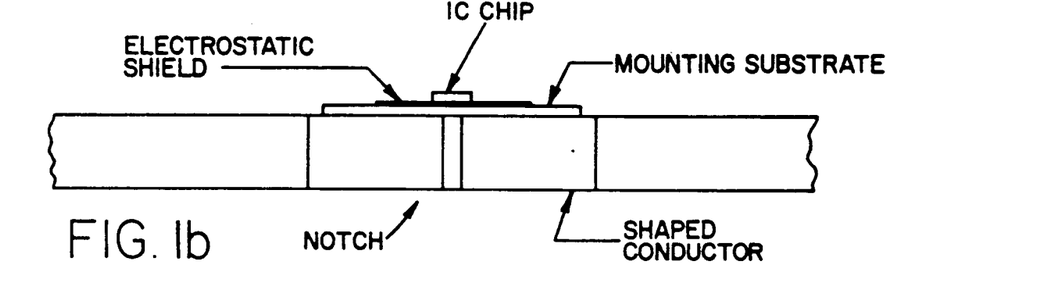

FIG. 1a illustrates a plan view of a differential current sensor, made in accordance with the present invention, and FIG. 1b illustrates a side view of the current sensor shown in FIG. 1a. In a preferred embodiment, an electrostatic shield is provided between the magnetic flux sensors in the integrated circuit chip. This is accomplished by a thin metal film between the mounting substrate and the integrated circuit chip. The metal film is connected to circuit ground while the current sensor is in use. The integrated circuit chip is, of course, provided with an insulating oxide film at the interface with the electrostatic shield.

Figure 1C:
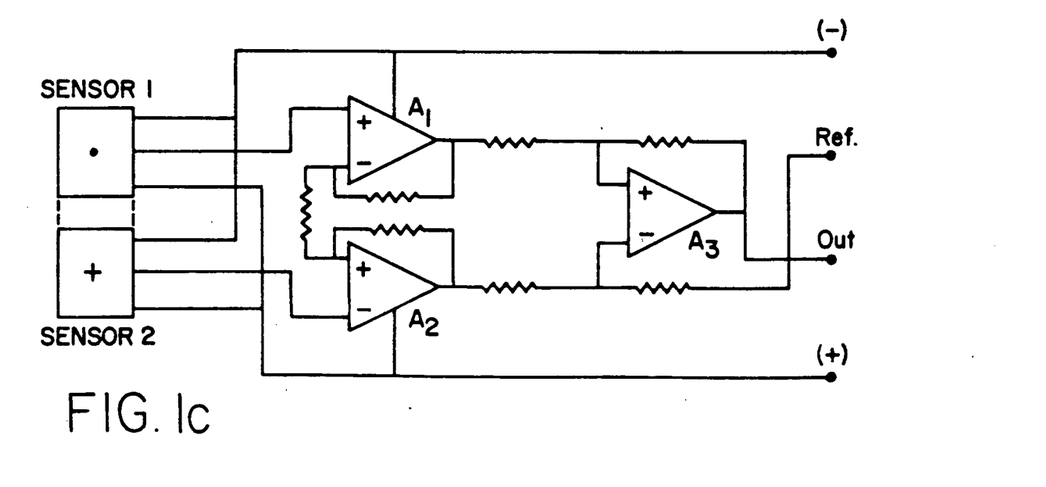
FIG. 1c illustrates schematically the integrated circuit comprised of two current sensors connected to an output terminal by a differential amplifier circuit.

FIG. 1c illustrates the integrated circuit comprised of sensors 1 and 2, and a differential amplifier circuit comprised of amplifiers $A_1$, $A_2$ and $A_3$. After bonding the (IC) chip on the mounting substrate, the substrate is bonded to a flat (bus) conductor notched as shown to produce a restrictive region between the centers of sensors 1 and 2 through which all of the current must pass. The chip is so positioned relative to the notched conductor as to place the centers of the two sensors on opposite sides of the conductor at the restrictive region, i.e., at the center of the notch. The substrate thus provides electrical isolation of the chip while placing the sensors (which may be Hall effect or magnetoresistive sensors) as close to the restrictive region of the notched conductor as possible. An electrostatic shield is provided as a thin film of nonmagnetic metal between the mounting substrate and the IC chip.

ANALYSIS

Figure 2A:
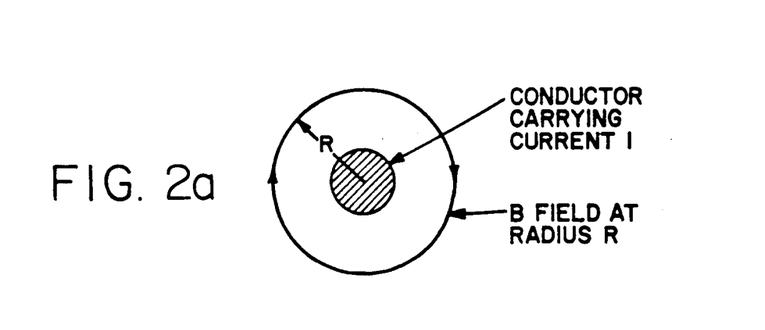
FIG. 2a illustrates a cross section of a cylindrical conductor and the magnetic flux (B) field surrounding it at radius R produced by current flowing through it.

From Ampere's Law, the magnetic field B (in gauss) that results from current I (in Amperes) flowing through a round conductor is $$B = \frac{0.2I}{R} \quad (1)$$

in which R is the distance from the center of the conductor to the point of observation as shown in FIG. 2a. Equation (1) may be rewritten to express the required distance, $R_s$, between the centers of a sensor and conductor, such that full-scale current $I_m$ results in full-scale flux $B_m$.

$$R_s = \frac{0.2 I_m}{B_m} \quad (2)$$

For a flux sensor which has a full-scale flux value of 400 gauss, Equation (2) becomes $$R_s = 5 \times 10^{-4} I_m \quad (3)$$

Figure 2B:
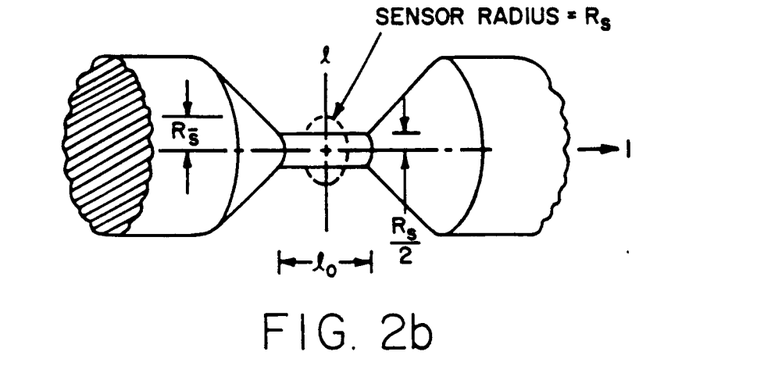
FIG. 2b illustrates a perspective view of a cylindrical conductor with a restricted region.

Thus, for a current sensor having a full-scale current of one ampere, $R_s$ is $5 \times 10^{-4}$ cm or 5 μm. Clearly, it would be impossible to construct such a sensor using a discrete sensor and conductor. Monolithic construction, which integrates the conductor with the flux sensor, is absolutely necessary for such low current applications. However, for a large current sensor having a full-scale current of 500 amperes, $R_s$ is 0.25 cm, a separation that is amenable to fabrication using a discrete current conductor combined with a separate flux sensor. For both the small monolithic sensor and the large hybrid sensor, the current conductor cross-section must be relatively small in the vicinity of the flux sensor as determined by Equation (3). This means that some sort of "necking down" or constriction must be applied to the conductor structure, as shown in FIG. 2b. This in turn adds to the conductor ohmic resistance while producing a hot spot at the point of constriction.

To estimate temperature rise, assume that most of the heat is produced in the constricted region, which has uniform circular cross-section of radius $R_s/2$ and length $l_o$ as shown in FIG. 2b. The total heat produced is $$P_o = RI^2 = \frac{\rho l_o I^2}{\sigma} \quad (4)$$

in which R is the resistance of the constricted region, $\rho$ is the conductor material resistivity, and $\sigma = \pi R_s^2/4$ is the cross-section of the constriction, where $R_s$ is the sensor radius defined above.

Heat flow at point 1 is $$P(l) = \frac{P_o l}{l_o} = \frac{\rho l I^2}{\sigma}, \quad \frac{-l_o}{2} \leq l \leq \frac{l_o}{2} \quad (5)$$

The temperature gradient at point 1 is $$\frac{dT}{dl} = \frac{P(l)}{K\sigma} = \frac{\rho l I^2}{K\sigma^2} \quad (6)$$

in which K is the conductor thermal conductivity.

Integrating from $l=0$ to $l=l_o/2$ gives the hot-spot temperature rise $$\Delta T = \int_0^{l_o/2} \frac{\rho l I^2}{K\sigma^2} dl = 1/8 \frac{\rho l_o^2 I^2}{K\sigma^2} \quad (7)$$

Noting that $\sigma = \pi R_s^2/4$ and $R_s = 0.2 I_m/B_m$, Equation (7) becomes $$\Delta T = \frac{127 \rho l_o^2 B_m^4}{K I_m^2} \quad (8)$$

If the aspect ratio, $l_o/R_s$ is assumed to be a constant, then Equation (8) may be written $$\Delta T = \frac{5.07 \rho B_m^2 \beta^2}{K} \quad (9)$$

Equation (9) is particularly useful in that $\Delta T$ is independent of physical size and full-scale current. If the aspect ratio ($\beta$) and full-scale flux are constants, $\Delta T$ will also be a constant. In practice, values of $\Delta T$ slightly higher than the Equation (9) value may be expected because of heating in the transition regions to the left and right of the constriction region. However, noting from Equation (7) that the gradient has a $1/\sigma^2$ or $1/R^4$ dependence, these effects are predicted to be relatively small.

As an example, consider the case of a copper conductor structure having an aspect ratio of 5:1, and a flux sensor having a $B_m$ of 400 gauss. Noting that the room temperature resistivity of copper is 1.2 μΩ-cm and the thermal conductivity is 3.87 W/cm−°C., Equation (9) predicts a hot-spot ΔT (at l=0) of 6.29° C. at continuous full-rated current. This example indicates that the FIG. 2b scheme is not expected to result in thermal problems, assuming aspect ratios and sensor placements similar to the above are maintained.

Voltage drop across the restricted region can be determined by noting that the total resistance of the constructed region is $$R_o = \rho l_o / \sigma \qquad (10)$$

Using the previous assumption that $\sigma$ is of circular cross-section and radius=$R_s/2$, Equation (10) may be written $$R_o = 4\rho l_o / \pi R_s^2 \qquad (11)$$

Because $l_o = \mu R_s$ and $R_s = 0.2 I_m / B_m$, $$R_o = 4\rho \beta / \pi R_s = \frac{4\rho \beta B_m}{\pi (0.2 I_m)} = \frac{6.37 \rho \beta B_m}{I_m} \qquad (12)$$

The voltage drop (at $I_m$) is $$\Delta V = R_o I_m = 6.37 \rho B_m \beta \qquad (13)$$

As with Equation (9), Equation (13) provides an estimate that is scale-independent; i.e., ΔV does not depend on physical size and full-scale current. Using the previous values of $\rho$, $B_m$ and $\beta$ (1.2 μΩ-cm, 400 gauss and 5:1, respectively), ΔV is calculated at 15.3 mV, which in general is of negligible impact.

CURRENT DENSITY

The full-scale current density within the constricted region is $$J = I_m / \sigma \qquad (14)$$

in which $\sigma$ is the constriction cross-section. Assuming fabrication that makes $\sigma = \pi R_s^2 / 4$ and combining this with Equation (2) gives $\sigma = 0.01 \, \pi I_m^2 / B_m^2$. Accordingly, Equation (14) becomes $$J = 31.8 \, B_m^2 / I_m \qquad (15)$$

STRAY FIELD SENSITIVITY

It can be seen from Equation (1) that the flux sensor sensitivity to external currents has a 1/R dependence (assuming the external conductor length is long as compared to R). Accordingly, if the sensitivity to external current is not to exceed, for example, 0.5% of the sensed current, then the external conductors must be no closer than 200 $R_s$ from the flux sensor. For both monolithic and hybrid constructions, this requirement represents an awkward and costly constraint.

Figure 3:
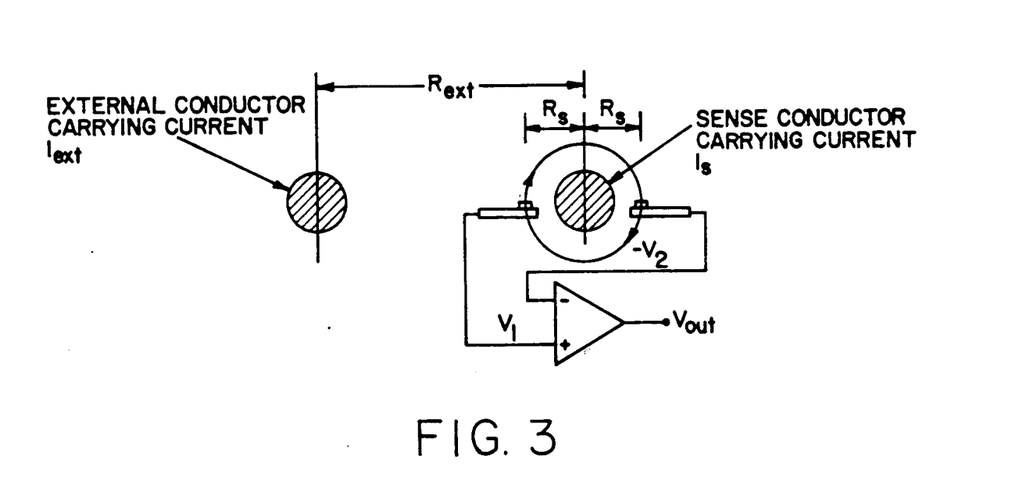
FIG. 3 illustrates a differential sensing scheme used in the present invention to reduce sensitivity to external current.

To reduce vulnerability to stray fields and enable closer routing between external conductors and the sensor, a differential flux sensor arrangement is necessary, as shown in FIG. 3. With this arrangement, sensitivity to desired signal is not only doubled, but also sensitivity to external currents is greatly reduced, as shown in the following analysis.

For each of the two flux sensors, let S be the ratio between the sensor output voltage and the normal components of B at the respective sensor location.

$$V_1 = S B_{y1} \qquad (16a)$$

$$V_2 = S B_{y2} \qquad (16b)$$

Applying Equation (1) to FIG. 3 gives $$V_1 = 0.2S \frac{I_s}{R_s} - \frac{I_{ext}}{R_{ext} - R_s} \qquad (17a)$$

$$V_2 = 0.2S \frac{-I_s}{R_s} - \frac{I_{ext}}{R_{ext} + R_s} \qquad (17b)$$

$$V_1 - V_2 = V_{out} = 0.4S \frac{I_s}{R_s} - \frac{R_s I_{ext}}{R_{ext}^2 - R_s^2} \qquad (18)$$

Assuming $R_s^2 << R_{ext}^2$, it follows that the ratio of sensitivity between the sensed and external current is $$\lambda = \frac{R_{ext}^2}{R_s} \qquad (19)$$

Accordingly, for a sensitivity ratio of 200:1, $R_{ext}/R_s = \sqrt{200} = 14$. This is a great improvement over the previous case in which the distance ratio was 200. For example, in the case of a sensor rated at 500 A full scale, using flux sensors rated at 400 gauss full scale, $R_s$ was determined to be 0.25 cm. Using the nondifferential scheme, the nearest allowed conductor would be 50 cm (20 in.) away. In contrast, with the differential arrangement of FIG. 3, the nearest conductor could be as close as 3.5 cm (1.4 in.).

The differential arrangement of FIG. 3 produces two other beneficial results; temperature drift and linearity are each improved because of cancellation effects.

SKIN EFFECTS

Figure 5A:
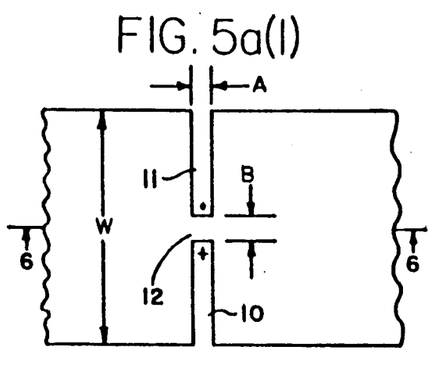
Figure 5B:
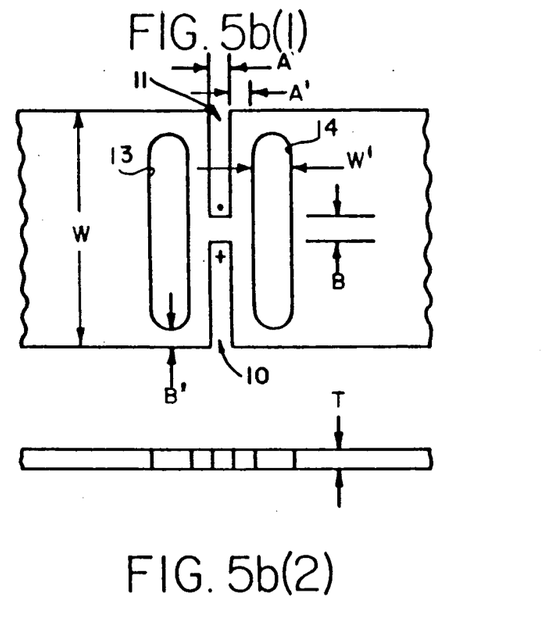

In the case of a long wire of uniform circular cross section, the B field external to the conductor is a function of current only and is independent of current distribution within the conductor. Accordingly, in this limiting case, B/I sensitivity is not influenced by skin effect, and B will remain proportionate to I, independent of frequency. On the other hand, for shaped conductors, such as shown in FIGS. 5a(1), 5b(1), 5c(1) and 5d(1) proximity effects will prevail, and sensed fields will depend on current distribution. In these cases, we can expect some frequency and phase distortion for sufficiently high frequencies. Because skin effects will generally place currents in closer proximity to the sensor, the end result will be an increase in sensitivity with increasing frequency. However, depending on geometry, the increase may be fairly small. Although details of this distortion are best observed experimentally from test results, an estimate of the "cross-over" frequency is gained by noting the skin frequency, i.e., the frequency at which wave penetration falls to 1/e:

$$f_s = \frac{\epsilon_0 C^2 \rho}{\pi \delta^2} = \frac{2.53 \times 10^7 \rho}{\delta^2} \qquad (20)$$

in which $\rho$ is material resensitivity and $\delta$ is the material thickness. Equating $\delta$ to $R_s/2$ and noting from Equation (2) that $R_s = 0.2 \, I_m/B_m$, a rough estimate of the cross-over frequency is achieved. For copper ($\rho = 1.2 \times 10^{-6}$ Ω-cm), the "cross-over" frequency is $$f_s = 3{,}040 \frac{B_m^2}{I_m^2} \tag{21}$$

It should be noted from Equation (21) that the "crossover" frequency varies as $1/I_m^2$, and therefore frequency distortion could be a problem for large sensors, depending on geometry.

SENSITIVITY

Figure 4:
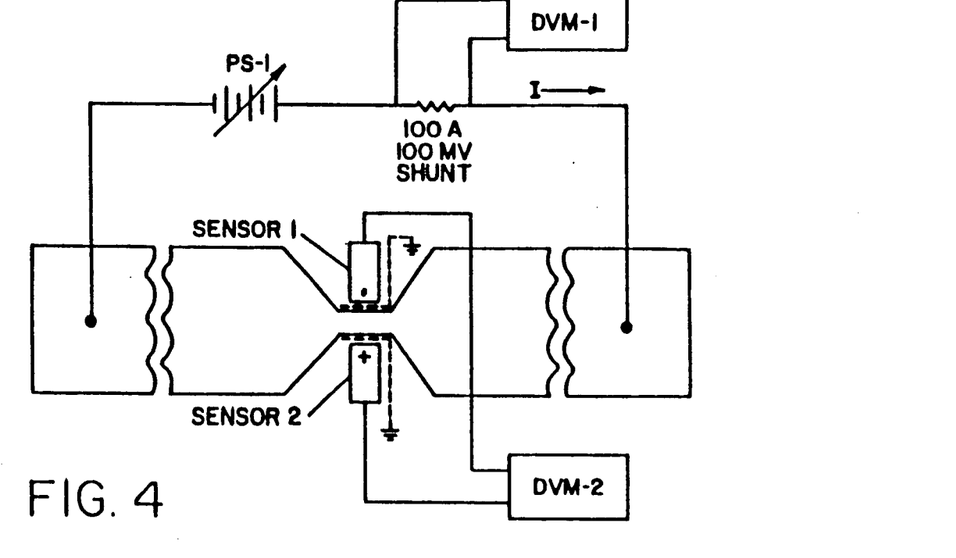
FIG. 4 illustrates a test arrangement for determining the ratio B/I of the constricted region of a conductor.

Sensitivity data was gathered using paired Micro Switch 91SS12-2 Hall effect flux sensing elements (labeled SENSOR 1 and SENSOR 2) in a test arrangement shown in FIG. 4, using two digital voltmeters DVM-1 and DVM-2, a variable DC voltage source PS-1 and a 100 A, 100 Mv shunt resistor. Four flat (0.062 inch thick and 0.75 inch wide) conductors were notched to provide a rectangular section 0.062 inch long and 0.062 inch wide (i.e., a cube 0.062 inch on each side), as shown in FIG. 5a(1) through 5d(1). In each case, the plan view is shown with a dot (.) and a plus (+) to indicate the flux surrounding the restricted region in the conductor made by matching the 0.75 inch wide conductor. The conductor is 0.062 inch thick and restricted by notches to leave a 0.062 inch restricted region 12 in every case except FIG. 5d(1). In FIG. 5d(1), the restricted region 12 is 0.062 inch×0.062 inch in cross section but 0.25 inch long. A side elevation of the shaped conductor is shown below the plan view for completeness.

Figure 5C:
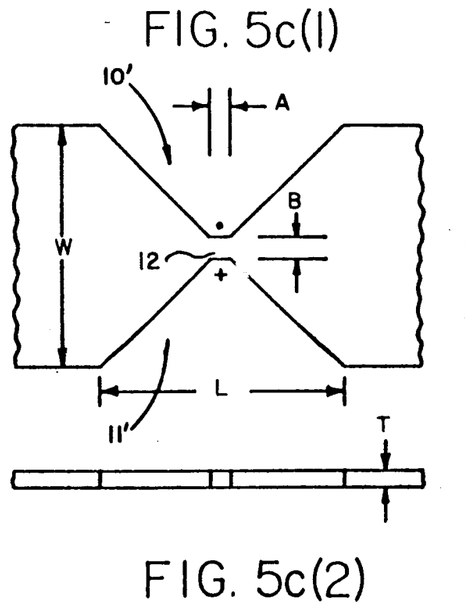
Figure 5D:
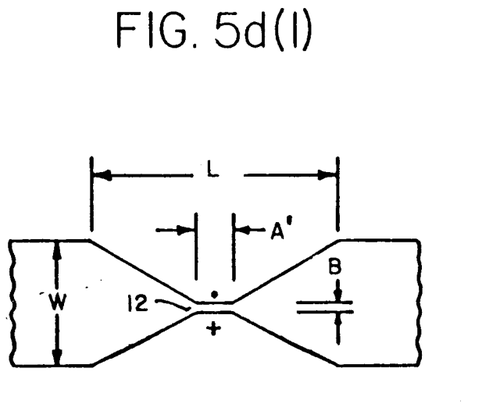
Figure 6:
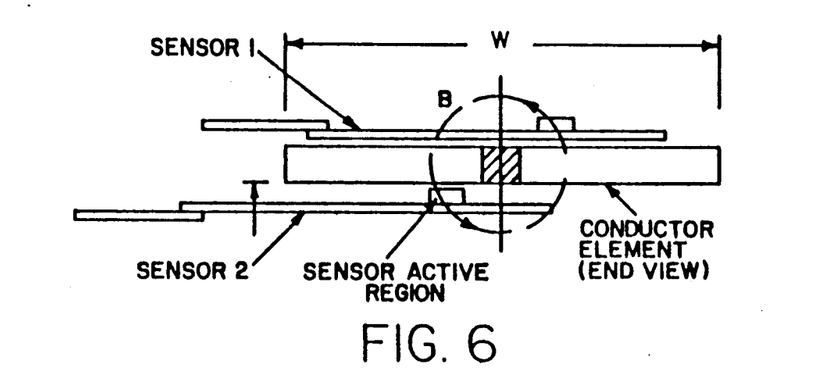
Figure 7:
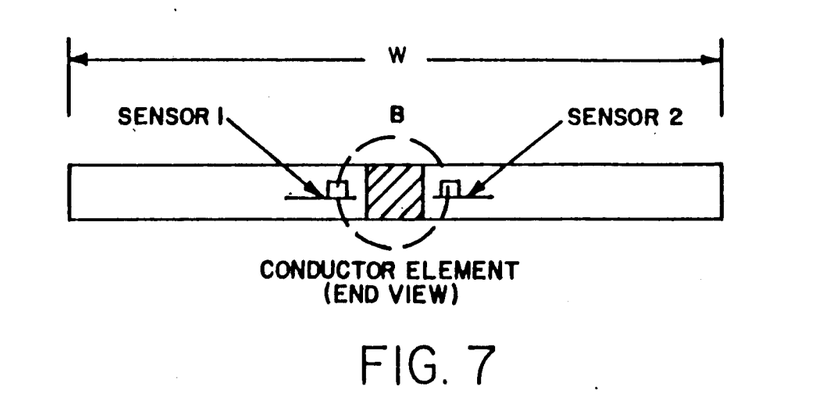
FIG. 7 illustrates a larger scale cross section of a conductor shown in FIG. 6 and two current sensors (Hall effect or magnetoresistive) ideally positioned opposite each other with respect to a center line of the conductor.

Referring to FIG. 5a(1), the notches 10 and 11 were a uniform 0.062 inch wide, and the Hall sensors were placed adjacent to the rectangular restricted region 12, as shown in FIG. 6, which shows a cross section of the shaped conductor taken along a line 6—6 of the plan view in FIG. 5a(1), although ideally they would be placed as shown in FIG. 7, which shows the smaller sensors placed midway between the upper and lower surface of the shaped conductor in the cross section taken along the line 6—6 in FIG. 5a(1). In FIG. 5b(1), oblong apertures 13 and 14 were made on each side of the "necked-down" section to restrict current flow through two paths that were 0.062×0.062 inches square in cross section on each side of the notches 10 and 11. The flux sensors were again positioned as before. In FIGS. 5c and 5d, notches 10' and 11' were formed, again leaving a necked-down section 12 that was a cube 0.062 inch on each side, and again the Hall sensors were positioned as shown in FIG. 6. For each of the four 500 A full-scale conductor elements shown in FIGS. 5a(1) through 5d(1), the measured sensitivity and B/I ratio is listed in Table 1.

TABLE 1

| | Conductor Sensitivities | | | |
|---|---|---|---|---|
| | CONDUCTOR | | | |
| | a | b | c | d |
| $\Delta V_{out}/\Delta I$ (V/A) | 0.00777 | 0.00783 | 0.00791 | 0.00772 |
| $\Delta B_{sensed}/\Delta I$ (gauss/A) | 0.518 | 0.522 | 0.527 | 0.515 |

Figure 8:
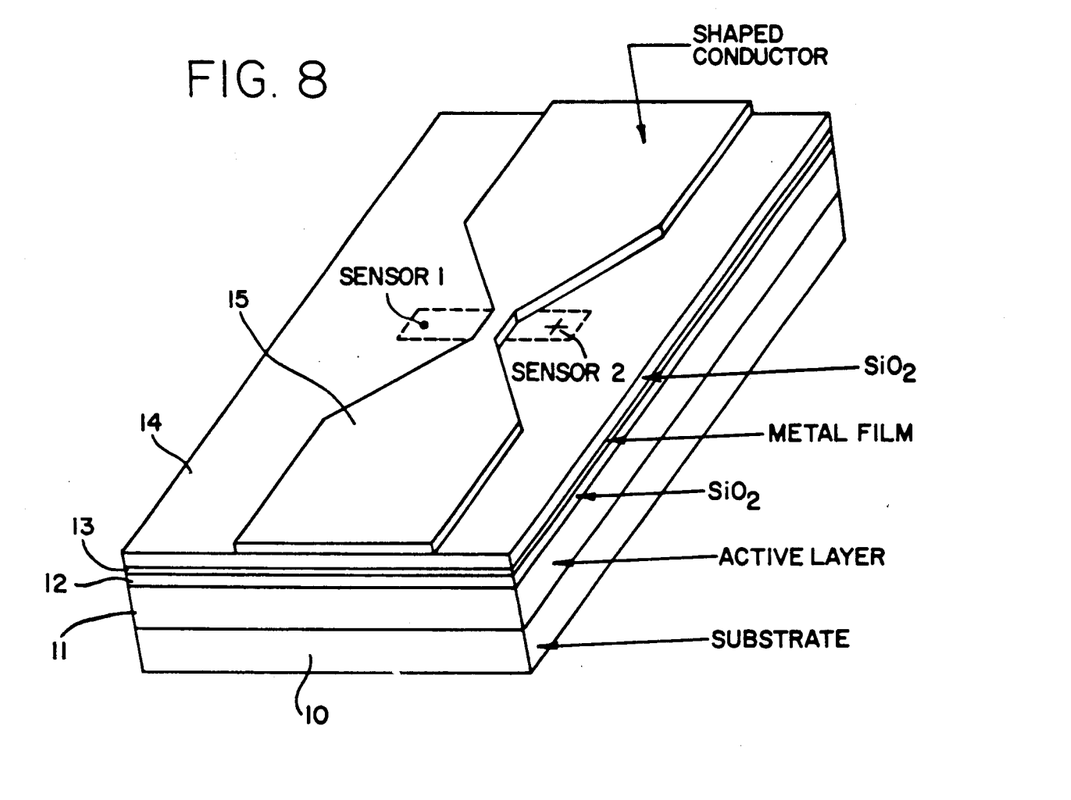
FIG. 8 illustrates in an isometric view a current sensor for low current applications fabricated with integrated circuit techniques.

Referring to FIG. 8, a truly integrated current sensor is shown fabricated in suitable semiconductor material, such as silicon, for small current applications. Starting with a silicon or other semiconductor substrate 10, an active layer 11 of suitably doped silicon is developed or epitaxially grown on the substrate. The circuit shown in FIG. 1c is then produced in this active layer, including the sensors 1 and 2. A thin insulating (oxide) layer 12 is then deposited or grown over the active layer 11 to electrically isolate the circuit and sensors from a thin metal film 13 deposited over the entire surface. The metal film serves as an electrostatic shield for the previously described circuitry. A second insulating layer 14 is then deposited or grown over the entire surface before a shaped conductor 15 is finally deposited with the narrow restrictive region positioned between the sensors 1 and 2. In that manner, the two sensors and the differential amplification circuitry of FIG. 1c are monolithically integrated with the shaped conductor of FIG. 1b.

At the present time, the Hall flux sensors made by Micro Switch, part number 91SS12-2, integrate one sensor with an amplification circuit and provide suitable mounting structure as illustrated in FIG. 6. Magnetoresistive sensors may be similarly fabricated with an integrated circuit on a semiconductor chip. The present invention integrates both sensors and differential amplification circuitry in a single chip with a shaped conductor deposited directly on the chip in proper position for differentially sensing magnetic flux through the two sensors in very close proximity. The size of the integrated circuit may, of course, be scaled up or down for different current capacities (ratings), but for larger currents, the "hybrid" construction illustrated in FIGS. 1a and b would be required.

Although particular embodiments of the invention have been described and illustrated herein, it is recognized that modifications and variations may readily occur to those skilled in the art. Consequently, it is intended that the claims be interpreted to cover such modifications and variations.

I claim:

1. A coreless and coilless current sensor comprising
    a shaped conductor having a single planar region of reduced cross section of the conductor through which total current must pass, and
    at least one coreless and coilless magnetic flux sensing element positioned in close proximity to said single planar region of reduced cross section of said conductor.

2. A coreless and coilless current sensor comprising
    a shaped conductor having a single planar region of reduced cross section of the conductor through which total current must pass,
    two coreless and coilless magnetic flux sensing elements positioned in close proximity to said single planar region of reduced cross section of said conductor on opposite sides thereof, said current sensors being disposed in a single plane, said single plane being parallel to said single planar region of said conductor, and
    differential amplifying means connected to said coilless magnetic flux sensors to produce an output voltage signal proportional to the difference in instantaneous magnetic flux vectors sensed by said sensor elements.

3. A current sensor comprising
    a shaped conductor having a restricted section comprising a constriction in one region to reduce the cross section of the conductor through which total current must pass,
    two magnetic flux sensing elements positioned in close proximity to said restricted section of said conductor on opposite sides thereof, and differential amplifying means connected to said magnetic flux sensors to produce an output voltage signal proportional to the difference in instantaneous magnetic flux vectors sensed by said sensor elements, wherein said two magnetic flux sensing elements and said differential amplifying means are produced on an integrated circuit chip with spacing between sensor elements for positioning said restrictive region of said shaped conductor between said sensor elements and in close proximity therewith, and an insulating substrate positioned between said semiconductor chip and said conductor.

4. A current sensor as defined in claim 3 wherein said shaped conductor is in the form of a flat bus and said constriction in said one region is formed with notches cut out on opposite edges, and said substrate is a flat piece of insulating material to which said shaped conductor is secured on one side and to which said chip is secured on the other side.

5. A current sensor as defined in claim 4 wherein said notches are rectangular and of even depth and width from each edge of said shaped conductor.

6. A current sensor as defined in claim 4 wherein said notches are V-shaped and of even depth with a flat portion at the point of furthest depth of each notch to leave a restricted section for conduction of current with parallel edges.

7. A current sensor as defined in claim 4 including an electrostatic shield between said current sensors and said shaped conductor.

8. A current sensor comprising a shaped conductor having a restricted section comprising a constriction in one region to reduce the cross section of the conductor through which total current must pass, two magnetic flux sensing elements positioned in close proximity to said restricted section of said conductor on opposite sides thereof, and differential amplifying means connected to said magnetic flux sensors to produce an output voltage signal proportional to the difference in instantaneous magnetic flux vectors sensed by said sensor elements, wherein said two magnetic flux sensing elements and said differential amplifying means are produced in an integrated circuit chip with spacing between said sensor elements for positioning said restricted section of said shaped conductor between said sensor elements and in close proximity therewith, and with said shaped conductor deposited on said integrated circuit chip with a thin insulating layer between said integrated circuit chip and said shaped conductor.

9. A current sensor as defined in claim 8 wherein said restricted section in said shaped conductor is formed with rectangular notches of even depth and width from each edge of said shaped conductor.

10. A current sensor as defined in claim 8 wherein said restricted section in said shaped conductor is formed with V-shaped notches of even depth with a flat portion at the point of furthest depth of each notch to leave a restricted section for conduction of current with parallel edges.

11. A current sensor as defined in claim 8 including a thin film of metal between said sensor elements in said integrated circuit chip and said shaped conductor with insulating material between said thin film of metal and said sensor element, and insulating material between said shaped conductor and said thin film of metal to provide an electrostatic shield between said sensor elements and said shaped conductor.

* * * * *